United States Patent [19]

Ishiguro et al.

[11] Patent Number: 5,027,428
[45] Date of Patent: Jun. 25, 1991

[54] POWER SAVING ARRANGEMENT AND POWER SAVING METHOD

[75] Inventors: Kazuhisa Ishiguro, Nitta; Yutaka Sekiguchi, Oora, both of Japan

[73] Assignee: Sanyo Electric Co. Ltd., Osaka, Japan

[21] Appl. No.: 403,101

[22] Filed: Sep. 5, 1989

[30] Foreign Application Priority Data

Sep. 7, 1988 [JP] Japan .................. 63-224038

[51] Int. Cl.⁵ .................. H04B 01/16; H04B 17/00
[52] U.S. Cl. .................. 455/67; 455/343
[58] Field of Search .................. 455/127, 226, 343, 67

[56] References Cited

U.S. PATENT DOCUMENTS

| | | | |
|---|---|---|---|
| 4,598,258 | 7/1986 | Babano | 331/14 |
| 4,903,335 | 2/1990 | Shimizu | 455/343 |

FOREIGN PATENT DOCUMENTS

| | | | |
|---|---|---|---|
| 0154838 | 11/1981 | Japan | 455/343 |
| 0124626 | 5/1988 | Japan | 455/343 |

*Primary Examiner*—Reinhard J. Eisenzopf
*Assistant Examiner*—Chi H. Pham
*Attorney, Agent, or Firm*—Darby & Darby

[57] ABSTRACT

A power saving arrangement for use in a handset unit which communicates with a base unit in response to the detection of an ID signal leading data signal, which are produced from the base unit, includes a processing circuit for receiving and processing the ID signal and data signal, and a detecting circuit, connected to the processing circuit, for detecting the ID signal and data signal. A CPU controls the power supply such that, under the first standby mode a reduced power is supplied to the processing circuit, and no power to the detecting circuit. Under the second standby mode as established when the detected level of the received signal exceeds a predetermined level, the reduced power is supplied to the processing circuit means and also to the detecting circuit means. Under the use mode as established when the detected ID signal has a predetermined pattern, full power is supplied to the processing circuit and also to the detecting circuit.

10 Claims, 4 Drawing Sheets

POWER SAVING ARRANGEMENT AND POWER SAVING METHOD

BACKGROUND OF THE INVENTION

1. Field of the Invention

The present invention generally relates to a power saving arrangement and power saving method for use in subsidiary unit, such as a handset unit, which communicates with a base unit in response to the detection of an ID signal produced from the base unit.

2. Description of the Prior Art

Recently, many developments have been made on pocket size receiver, for example, cordless telephones, radio pagers or portable telephones, which can effect wireless communication between a base unit and a handset unit.

In these receivers referred to above, portability is particularly emphasized, and accordingly a various circuit arrangements are incorporated in a monolithic IC or the like driven by a battery. Thus, from the viewpoint of power saving, a standby mode is presented. When the standby mode is established, the electric power from the battery is supplied to the various circuits intermittently in pulses having a predetermined frequency, so that the handset unit can detect and analyze the ID signal transmitted from the base unit. When the ID signal is detected, the handset unit is changed from the standby mode to the use mode to detect data signal following the ID signal, thereby starting communication between the handset unit and the base unit. Thus, during the standby mode, the power consumption is saved.

An example of a prior art power saving arrangement is shown in FIG. 4.

The circuit shown in FIG. 4 includes a battery 1 which is a power source for the handset unit such as in a cordless phone system, a radio frequency amplifier 2, a mixing circuit 3, a local oscillator 4, an intermediate frequency amplifier 5, a demodulator 6, a signal strength detecting circuit 7 which operates as a detector for detecting the signal level of the received signal, and a waveform shaping circuit 9 for shaping the ID signal from the demodulator 6. A CPU 10 functions to analyze the pattern of received ID signal and to change the mode between standby mode and use mode. During the standby mode, CPU 10 produces a power saving signal PSS to operation control circuit 11 which then produces power in pulses having a predetermined frequency, and supplies the pulsating power to various circuits. Such an intermittent power supply to various circuits is not sufficient to properly process the data signal from the base unit, but is sufficient to analyze the ID signal. Thus, during the standby mode, power necessary to analyze the ID signal is constantly supplied to the various circuits, such as to IF amplifier 5, demodulator 6 and waveshaping circuit 9. When the pattern of the detected ID signal coincides with the pattern stored in CPU 10, the mode is changed from the standby mode to use mode. Under the use mode, the power saving signal PSS is cut off so that the operation control circuit 11 continuously provides the full power to the various circuits.

According to the prior art power saving arrangement, since the intermediate frequency amplifier circuit 5, demodulator circuit 6 and waveform shaping circuit 9 are continuously operated even during the standby mode to analyze the ID signal, there is such a problem that the power consumption during the standby mode is still quite high.

SUMMARY OF THE INVENTION

Accordingly, the present invention has been developed with a view to substantially eliminating the above-described problem in the prior art, and has for its essential object to provide an improved power saving arrangement and power saving method which can further save the power during the standby mode.

In accomplishing these and other objects, a power saving arrangement according to the present invention comprises: power control circuit for selectively producing a full power and a reduced power; a processing circuit means for receiving and processing said data signal when the full power is applied thereto, and for detecting the level of a received signal when the reduced electric power is applied thereto; detecting circuit means, connected to said processing circuit means, for detecting data signal when the full power is applied thereto, and for detecting only ID signal when the reduced power is applied thereto; first switching means for making and braking a power supply path to said detecting circuit means from said power control circuit; and control means for controlling said power control circuit and said first switching means to establish either one of first standby mode, second standby mode and use mode such that: under the first standby mode, said first switching means breaks the power supply to said detecting circuit means and, at the same time, power control circuit produces the reduced power to said processing circuit means, ready to detect the level of said ID signal; under the second standby mode as established when said control means detects that received signal level exceeds a predetermined level, said first switching means makes the power supply to said detecting circuit means and, at the same time, power control circuit produces the reduced power to said processing circuit means and also to said detecting circuit means, ready to detect and read the pattern of said ID signal; and under the use mode as established when said control means detects that said ID signal has a predetermined pattern, said first switching means makes the power supply to said detecting circuit means and, at the same time, power control circuit produces the full power to said processing circuit means and also to said detecting circuit means, ready to detect and read said data signal.

Also, according to the present invention, power saving method comprises the steps of: providing a reduced power to said processing circuit means and providing no power to said detecting circuit means, when ID signal and data signal are not present, ready to detect the level of said received signal by said processing circuit means; providing said reduced power to said processing circuit means and also to said detecting circuit means, when the detected received signal level exceeds a predetermined level, ready to detect the pattern of said ID signal by said detecting circuit means; and providing full power to said processing circuit means and also to said detecting circuit means, when the detected ID signal pattern is identical to a predetermined pattern, ready to detect and reproduce the data signal.

BRIEF DESCRIPTION OF THE DRAWINGS

These and other objects and features of the present invention will become apparent from the following description taken in conjunction with a preferred embodiment thereof with reference to the accompanying drawings, through which like parts are designated by like reference numerals, and in which.

DESCRIPTION OF PREFERRED EMBODIMENT

Figure 1:
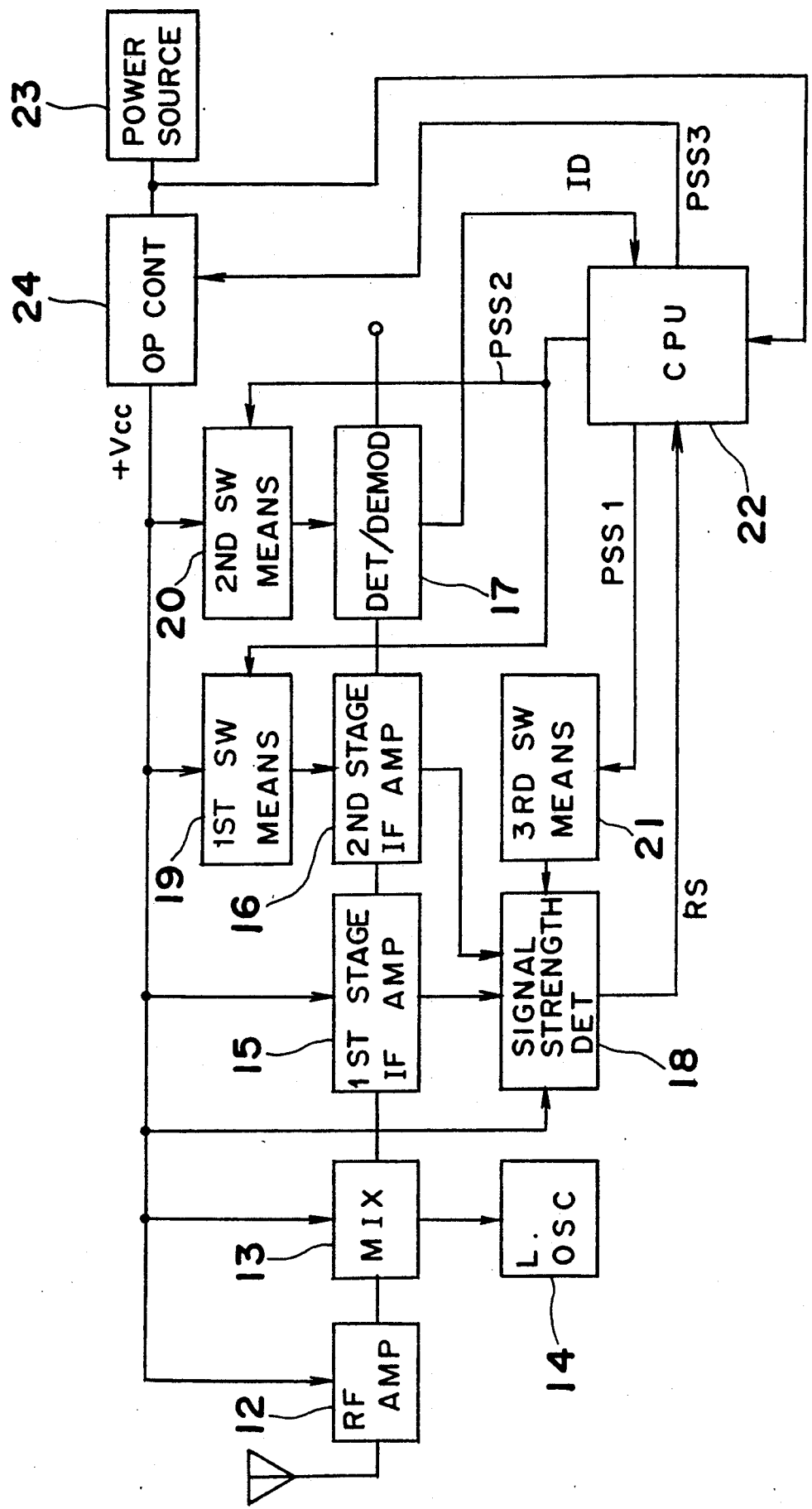
FIG. 1 is a block diagram of a power saving circuit arrangement according to a preferred embodiment of the present invention.
Figure 2:
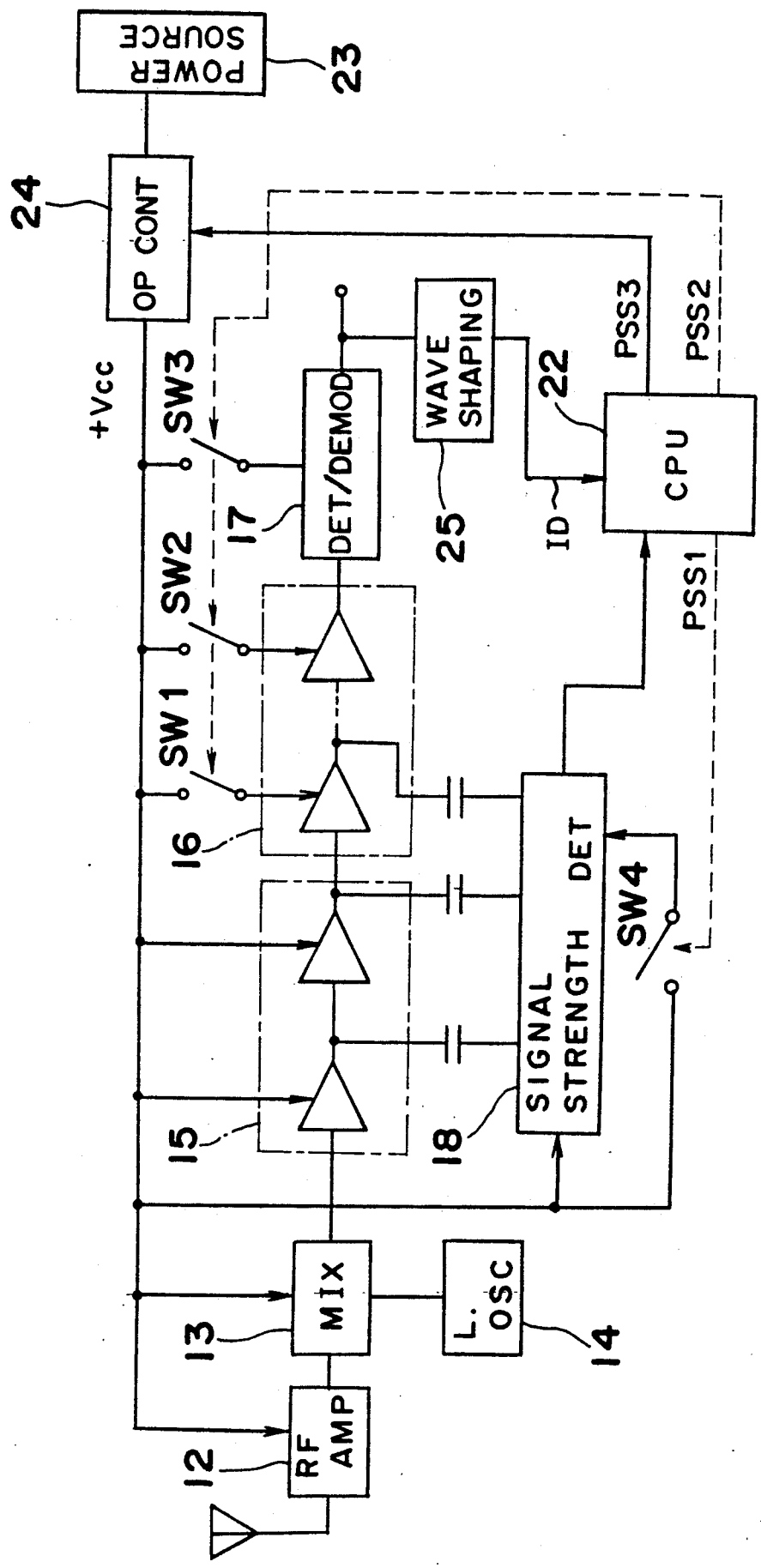
FIG. 2 is a circuit diagram of a power saving circuit arrangement of FIG. 1.

Referring to FIGS. 1 and 2, a power saving circuit arrangement and the power saving method according to the present invention will be described hereinbelow.

In FIGS. 1 and 2, reference numeral 12 represents a radio frequency amplifier circuit for amplifying waves received by an antenna of a cordless phone system or the like; 13 is a mixing circuit for converting high frequency signals to intermediate frequency signals; 14 is a local oscillator; 15 is a first stage intermediate frequency amplifier; 16 is a second stage intermediate frequency amplifier; and 17 is a detector/demodulator for detecting audio signals from the intermediate frequency signals, which are connected in series. Detector/demodulator 17 also produces an ID signal which has been produced from the base unit (not shown) and processed and amplified through circuits 12, 13, 14, 15, 16 and 17. The ID signal from circuit 17 is applied to a CPU 22 in which it is detected whether or not the detected ID signal is the same as the ID signal assigned to the handset unit. Preferably, as shown in FIG. 2, the ID signal is formed by a waveform shaping circuit 25 which filters the output signal from the demodulator 17 and shapes up the waveform.

A signal strength detecting circuit 18 receives signals from first and second stage amplifiers 15 and 16 to generate an RS signal indicative of the strength of the intermediate frequency signals produced from the first and second stage amplifiers 15 and 16. The generated RS signal is applied to CPU 22.

An electric power to each of the circuits 12, 13, 14, 15, 16, 17 and 18 is supplied from a power source 23 through an operation control circuit 24. A power source 23 is, for example, a battery when the processing circuit is employed in a handset unit of a cordless phone system. Furthermore, according to the present invention, the electric power to the second stage amplifiers 16 and modulator 17 are further controlled by first and second switching means 19 and 20, respectively. As diagrammatically shown in FIG. 2, the first switching means 19 includes two switches SW1 and SW2, and the second switching means 20 includes a switch SW3. Also according to the present invention, the electric power to a portion of signal strength detecting circuit 18 is further controlled by a third switching means 21, which is diagrammatically shown by a switch SW4 in FIG. 2.

CPU 22 produces power saving signals PSS1, PSS2 and PSS3 which are applied to third switching means 21, first and second switching means 19 and 20, and operation control circuit 24, respectively. The power saving signals PSS1 and PSS2 control ON/OFF operations of the first and second switching means 19 and 20, and the power saving signal PSS3 controls operation control circuit 24 such that operation control circuit 24 generates an intermittent operating voltage +Vcc in pulses having a predetermined frequency when the power saving signal PSS3 is present, but it generates a continuous operating voltage +Vcc when the power saving signal PSS3 is not present.

By using the RS signal and ID signal, CPU 22 determines the mode which is either a first standby mode, a second standby mode or a use mode.

Figure 3:
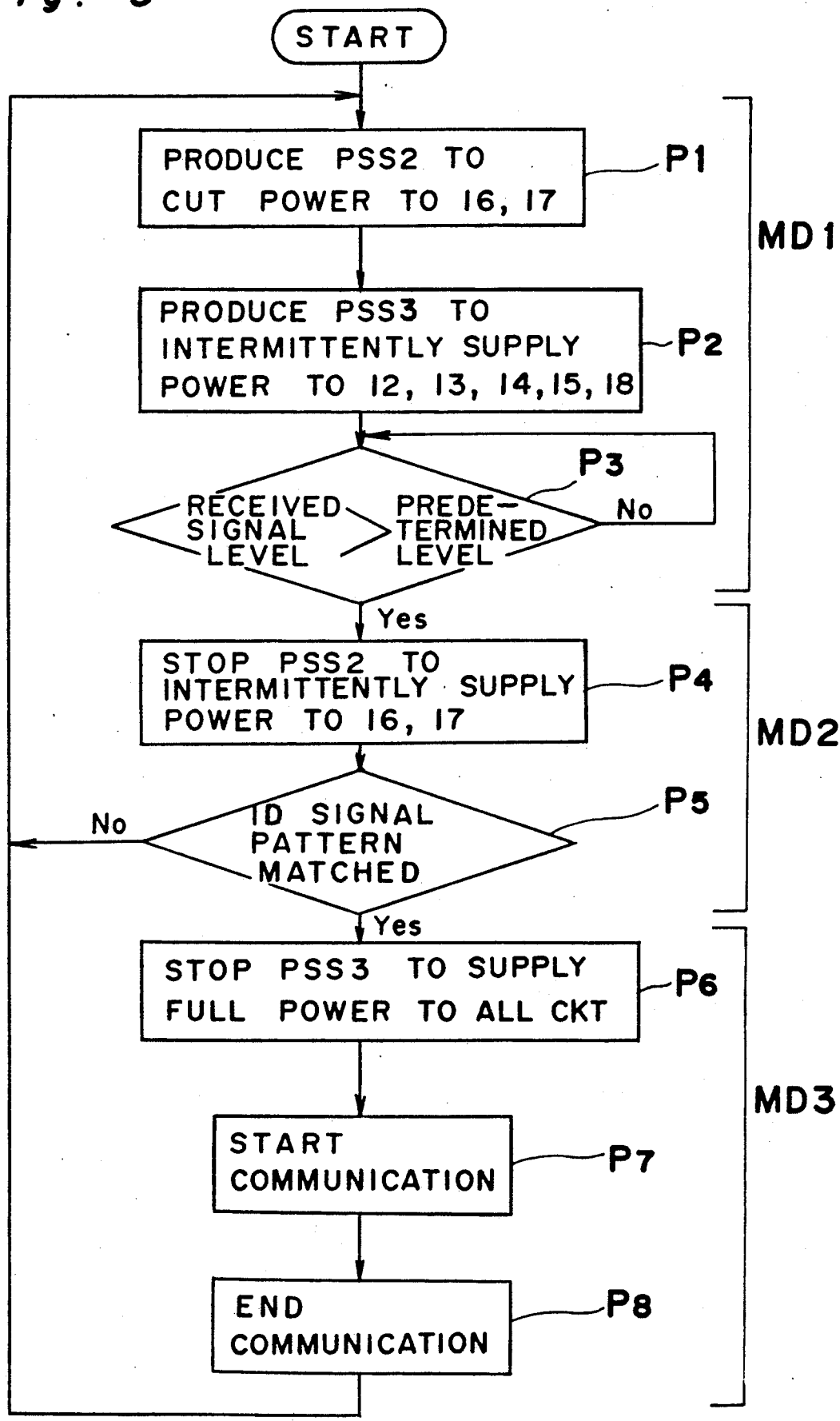
FIG. 3 is a flow-chart showing the operation of the power saving circuit arrangement of the present invention.
Figure 4:
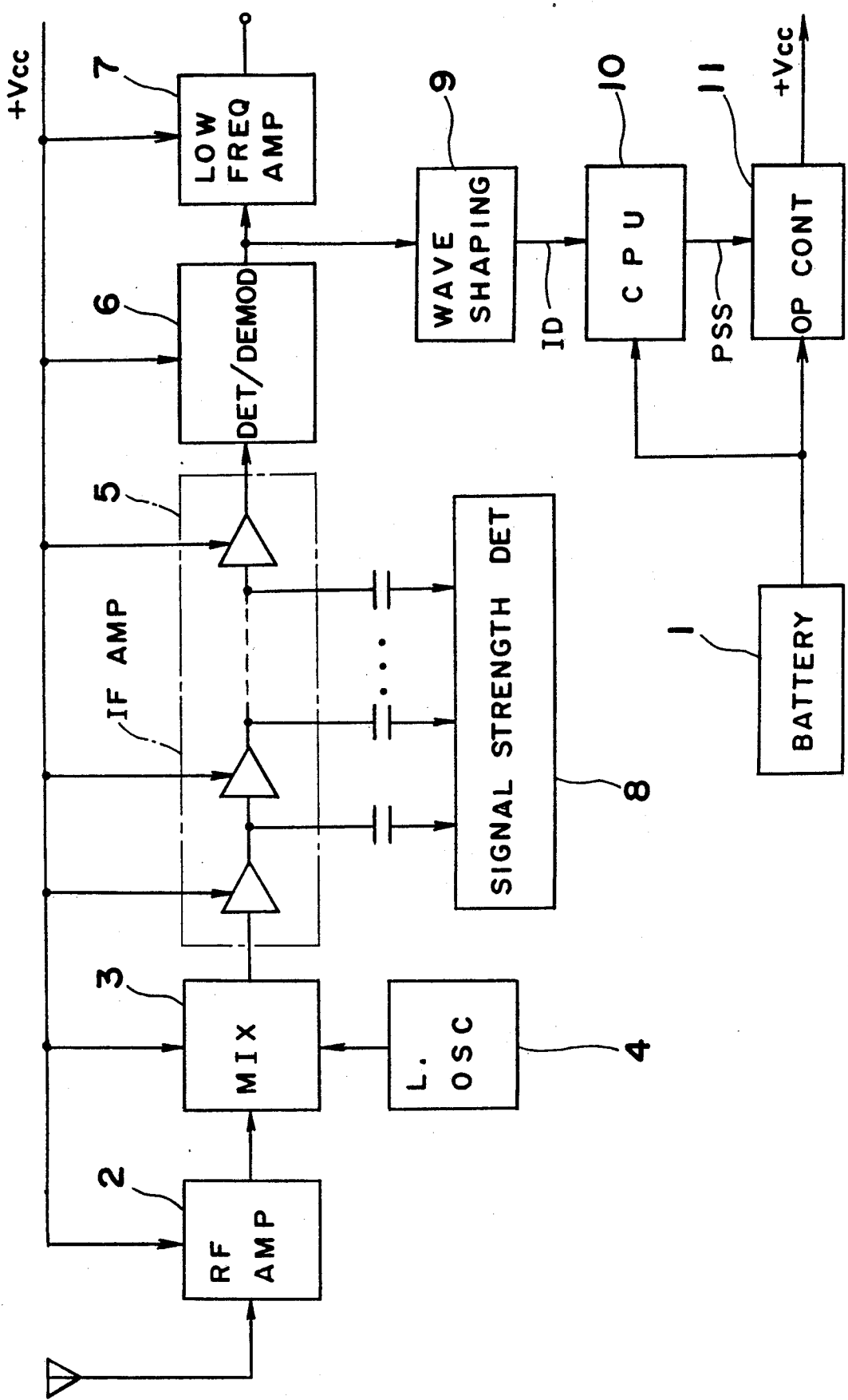
FIG. 4 is a circuit diagram of a prior art power saving circuit arrangement of a received wave processing circuit.

The operation of the power saving circuit shown in FIGS. 1 and 2 will be described hereinbelow with reference to the flow chart of FIG. 3. In FIG. 3, the operation under the first standby mode is indicated by MD1 covering steps P1-P3, the second standby mode by MD2 covering steps P4 and P5, and the use mode by MD3 covering steps P6-P8, respectively.

Under the first standby mode MD1, power saving signals PSS1, PSS2 and PSS3 are produced. Thus, at step Pl, by the power saving signal PSS2, the first and second switching means 19 and 20 are both turned off so that the electric power from the operation control circuit 24 to each of second stag intermediate frequency amplifier 16 and detector/demodulator 17 is cut off. Also, by the power saving signal PSS1, the third switching means 21 is turned off so that the electric power to the portion of signal strength detecting circuit 18 is cut off.

Then at step P2, by the power saving signal PSS3, operation control circuit 24 is so operated as to produce pulsating power at a predetermined frequency (also referred to as an intermittent voltage (+Vcc) power). Thus, first stage intermediate frequency amplifier 15, mixing circuit 13, local oscillator 14 and radio frequency amplifier circuit 12 and a portion of signal strength detecting circuit 18 are operated intermittently.

Thus, under the first standby mode MD1, no power is consumed in circuits 16 and 17 and reduced power is consumed in circuits 12, 13, 14, 15 and 18, the rate of reduction being dependent on the duty ratio of the intermittent voltage power as set in operation control circuit 24. Accordingly, by the half powered circuits 12, 13, 14, 15 and 18, the signal received by the antenna will not be processed properly, but is processed sufficiently to detect the level of the received signal. Such a detection of the received signal level is carried out particularly in signal strength detecting circuit 18 which then produces RS signal representing the received signal level.

At step P3, it is detected in CPU 22 using the RS signal whether or not the received signal level is greater than a predetermined level. If no signal is being received or if the receiving signal level is lower than the predetermined level because, e.g., the handset unit is far from the base station, step P3 for the detection of RS signal is repeated. On the contrary, if it is detected that the received signal level is greater than the predetermined level, the program advances to step P4 to enter the second standby mode MD2.

Under the second standby mode, power saving signals PSS1 and PSS2 ar stopped and only the power saving signal PSS3 is applied to operation control circuit 24.

Thus, at step P4, by the absence of power saving signals PSS1 and PSS2, the first and second switching means are turned on to permit intermittent voltage (+Vcc) power supply from power control circuit 24 to second stage amplifier 16 and to detector/demodulator 17. Thus, at this point, all the circuits 12, 13, 14, 15, 16, 17 and 18 are provided with intermittent voltage (+Vcc) power from circuit 24. Such a reduced power is not sufficient to proper detect and reproduce the audio signals, but is sufficient to properly detect and reproduce ID signal which is applied to CPU 22. Then, at step P5, it is detected in CPU 22 whether or not the received ID signal has a pattern which is identical to the ID signal pattern assigned to that handset unit. If the ID signal pattern does not match, the program returns to step P1 to start from the first standby mode. If the ID signal pattern does match, the program advances to step P6 to enter the use mode.

Under the use mode, all the power saving signals PSS1, PSS2 and PSS3 are stopped. By the absence of power saving signals PSS1 and PSS2, the first, second and third switching circuits are turned on, and by the absence of power saving signal PSS3, operation control circuit 24 is so operated as to produce full power, i.e., continuous voltage (+Vcc) power. Thus, circuits 12, 13, 14, 15, 16, 17 and 18 are operated with full power to properly detect and generate the received audio signal, thereby enabling communication between the base unit and the handset unit at step P7. When the communication ends (step P8), the program returns to step P1 to start the first standby mode.

Thus, in the manner as described hereinabove, the power saving operation is effected in two different levels, i.e., the high percentage saving as effected under the first standby mode MD1, and low percentage saving as effected under the second standby mode MD2.

More specifically, under the first standby mode MD1, that is, when no signal is received or when the received signal is weak, only circuits 12, 13, 14 and 15 and a portion of circuit 18 are operated with about half or less power, depending on the duty ratio of the pulsating voltage (+Vcc) power which is sufficient to receive and detect the level of the ID signal. Thus, under the first standby mode MD1, the power for operating circuits 16 and 17 is saved, and also some percentage of power for operating circuits 12, 13, 14, 15 and 18 is saved.

Under the second standby mode MD2, that is, when the received signal has a sufficiently large strength, circuits 12, 13, 14, 15, 16, 17 and 18 are operated with about half or less power, which is sufficient to detect and read the ID signal pattern. Thus, under the second standby mode MD2, some percentage of power for operating circuits 12 to 18 is saved.

As has been described hereinabove, according to the present invention, since the receiving mode is divided into three modes, the power consumption can be reduced to a large extent, and the life time of the battery can be prolonged.

Although the present invention has been fully described by way of example with reference to the accompanying drawings, it is to be noted here that various changes and modifications would be apparent to those skilled in the art. Therefore, unless otherwise such changes and modifications depart from the scope of the present invention, they should be construed as included therein.

What is claimed is:

1. A power saving arrangement for use in a subsidiary unit which communicates with a base unit in response to the detection of an ID signal leading data signal which are produced from said base unit and received by said subsidiary unit, said power saving arrangement comprising:
    power control circuit for selectively producing a full power and a reduced power;
    a processing circuit means for receiving and processing said data signal when the full power is applied thereto, and for detecting the level of the received signal when the reduced electric power is applied thereto;
    detecting circuit connected to said processing circuit means for detecting said data signal when the full power is applied thereto, and for detecting only said ID signal when the reduced power is applied thereto;
    first switching means for making and breaking a power supply path to said detecting circuit means from said power control circuit; and
    control means responsive to a signal representing the level of the received signal obtained from said processing means and also to said ID signal obtained from said detecting circuit means for controlling said power control circuit and said first switching means to establish either one of first standby mode, second standby mode and use mode such that:
    under the first standby mode, said first switching means breaks the power supply to said detecting circuit means and, at the same time, said power control circuit produces the reduced power to said processing circuit means, ready to detect the level of the received signal;
    under the second standby mode as established when said control means detects that the received signal level exceeds a predetermined level, said first switching means makes the power supply to said detecting circuit means and, at the same time, power control circuit produces the reduced power to said processing circuit means and also to said detecting circuit means, ready to detect and read the pattern of said ID signal; and
    under the use mode as established when said control means detects that said ID signal has a predetermined pattern, said first switching means makes the power supply to said detecting circuit means and, at the same time, power control circuit produces the full power to said processing circuit means and also to said detecting circuit means, ready to detect and read said data signal.

2. A power saving arrangement as claimed in claim 1, wherein said processing circuit means comprises a signal strength detecting circuit for detecting the signal level of the received signal.

3. A power saving arrangement as claimed in claim 2, further comprising a second switching means which operates synchronizingly with said first switching means for making and breaking the power supply partially to said signal strength detecting circuit.

4. A power saving arrangement as claimed in claim 1, wherein said processing circuit means comprises a first stage amplifier.

5. A power saving arrangement as claimed in claim 1, wherein said detecting circuit means comprises a second stage amplifier and a detector/modulator circuit.

6. A power saving arrangement as claimed in claim 1, wherein said control means comprises a CPU.

7. A power saving arrangement as claimed in claim 1, wherein said power control circuit comprises an operation control for producing said full power or said reduced power.

8. A power saving arrangement as claimed in claim 7, wherein said operation control produces power intermittently thereby generating said reduced power.

9. A power saving method for use in a subsidiary unit which communicates with a base unit in response to the detection of an ID signal leading data signal which are produced from said base unit, said subsidiary unit having a processing circuit means for receiving and processing said ID signal and data signal, control means for generating a control signal in response to output signals from said processing circuit means and said detecting circuit means, and power control means for generating either one of a reduced power signal and a full power signal in response to said control signal, the power saving method comprising the steps of:

providing a reduced power to said processing circuit means and providing no power to said detecting circuit means when said ID signal and data signal are not present, being ready to detect the level of the received signal by said processing circuit means;

providing said reduced power to said processing circuit means and also to said detecting circuit means from power control means when the detected received signal level exceeds a predetermined level and being ready to detect the pattern of said ID signal by said detecting circuit means; and providing full power to said processing circuit means from power control means when the detected ID signal pattern is identical to a predetermined pattern and being ready to detect and reproduce the data signal.

10. A power saving method as claimed in claim 9, wherein said reduced power is produced by intermittently generating the power.

* * * * *